United States Patent [19]
Cugini

[11] Patent Number: 5,764,069
[45] Date of Patent: Jun. 9, 1998

[54] HIGH DENSITY GRID FOR TESTING CIRCUIT BOARDS

[75] Inventor: Mario A. Cugini, Vista, Calif.

[73] Assignee: International Faster Corporation, Vista, Calif.

[21] Appl. No.: 549,984

[22] Filed: Oct. 30, 1995

[51] Int. Cl.$^6$ ............................................. G01R 31/02
[52] U.S. Cl. ............................................. 324/761
[58] Field of Search ........................... 324/761, 754, 324/755, 758

[56] References Cited

U.S. PATENT DOCUMENTS

| | | | |
|---|---|---|---|
| 4,340,858 | 7/1982 | Malloy | 324/761 |
| 4,701,703 | 10/1987 | Malloy | 324/761 |
| 4,884,024 | 11/1989 | DiPerna | 324/761 |
| 5,015,946 | 5/1991 | Janko | 324/761 |
| 5,049,813 | 9/1991 | Van Loan et al. | 324/754 |
| 5,157,325 | 10/1992 | Murphy | 324/761 |
| 5,180,976 | 1/1993 | Van Loan et al. | 324/754 |
| 5,389,885 | 2/1995 | Swart | 324/761 |
| 5,485,096 | 1/1996 | Aksu | 324/761 |
| 5,493,230 | 2/1996 | Swart et al. | 324/754 |

OTHER PUBLICATIONS

Everett Charles Technologies Densepak Product Bulletin, Sep. 29, 1995.

*Primary Examiner*—Ernest F. Karlsen
*Assistant Examiner*—Anh Phung
*Attorney, Agent, or Firm*—Calif Kip Tervo

[57] ABSTRACT

A test interface between an electrical circuit to be tested and a test controller generally includes a plurality of translation pins, a plurality of grid boards and a connector to a controller. Each translation pin has a first end disposed for electrical contact with a point to be tested on the circuit to be tested and has a second end; the second ends collectively forming an output grid. Each grid board includes a plurality of grid contacts printed on a peripheral receiving edge perpendicular to the boards faces. The plurality of grid boards are disposed such that the grid contacts form a receiving grid congruent with the output grid such that individual ones of the second ends of the translation pins make electrical contact with individual ones of the grid contacts. In an exemplary embodiment, the grid boards are arranged in groupings, each grouping including a switching grid board, at least one receiving grid board and electrical connection between the buss contacts of the receiving grid board and a circuit on the switching grid board. According to another embodiment of the invention, the high-density interface is integrated into a low-density interface by disposition between the low-density output grid and the electrical circuit to be tested.

21 Claims, 3 Drawing Sheets

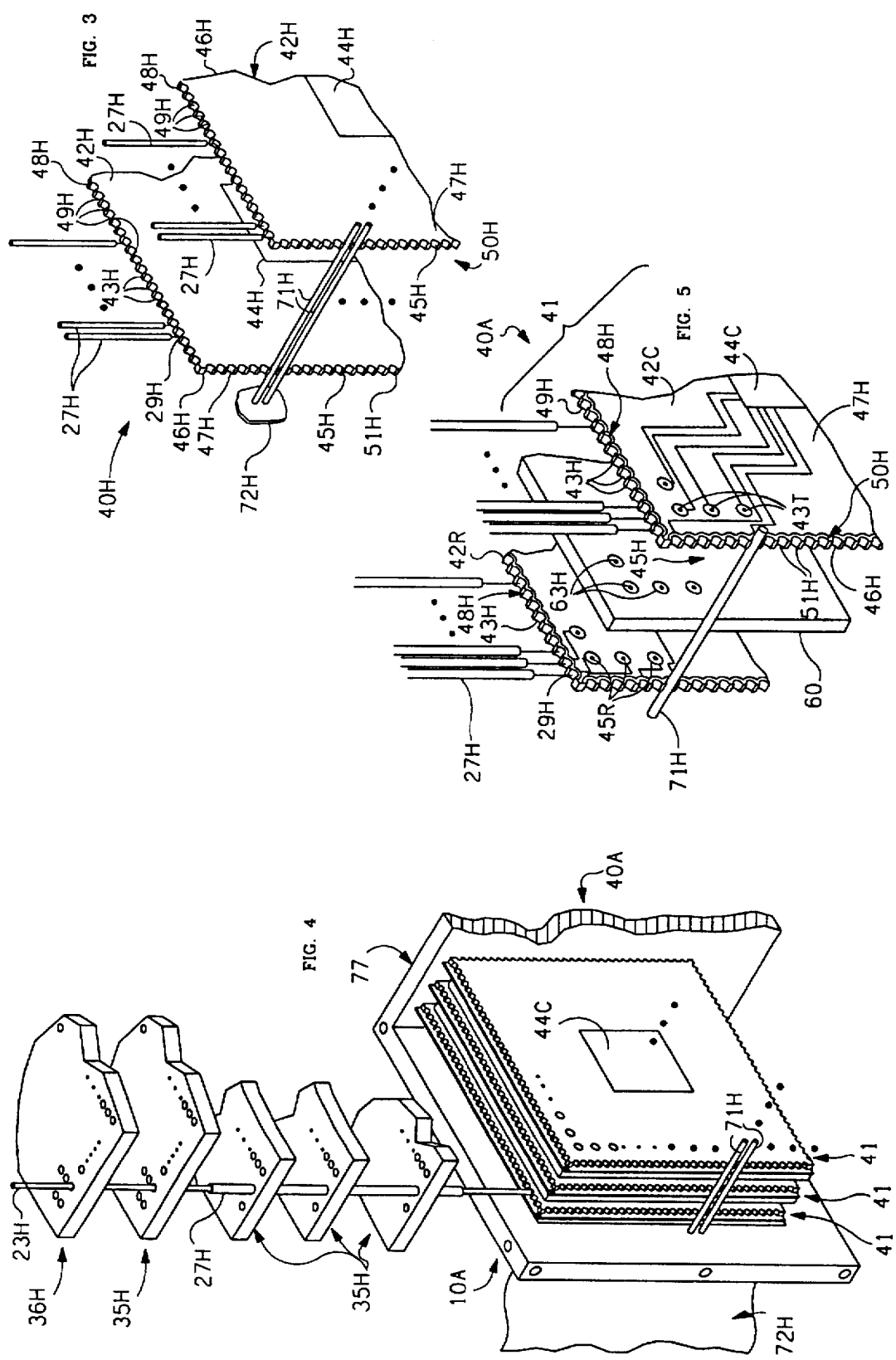

HIGH DENSITY GRID FOR TESTING CIRCUIT BOARDS

BACKGROUND OF THE INVENTION

1. Field of the Invention

This invention relates generally to a test fixture for electrical circuitry for electrical inspection of individual components and circuit paths on an electrical circuit, such as on a bare or loaded printed circuit (PC) board, wired backplane or rigid or flex ceramics. The invention more specifically relates to an improved test interface for testing PC boards of density exceeding the capabilities of conventional low-density interfaces and to a localized high-density interface including active switching circuitry for integration into a conventional low-density interface.

2. Description of the Related Art

Circuit testing of a PC board involves making contact with each electrical point on a circuit and sequentially monitoring each and every circuit component and each and every circuit path. In this manner, opens, shorts, missing components, wrong components, backwards or improperly installed components, and out of tolerance components can be individually identified. Hereinafter, the term "PC board" will be used as exemplary of the circuit to be tested and is generally meant to include any other type of circuit that may be tested in the manner described herein.

A complete circuit test system includes a controller with measurement circuitry, an electronic switching matrix with bed of nails output, and an interface or fixture imposed between the bed of nails and the test circuit. The controller switches between various multiple contact points on the PC board while monitoring the performance of the component or circuit path. The controller is typically controlled by a test program using a microprocessor or mini-computer.

The test interface or test fixture must be configured for each specific PC board to be tested. The test interface must make electrical connection between the bed of nails and each node on the PC board. The fixture includes a bed of translation pins specifically configured for the PC board, each pin having a first end in electrical contact with a node to be tested on the PC board and having a second end. The second ends of the translation pins form a standardized output grid for electrical connection to the bed of nails input grid of the switching portion. A conventional output gird is on 0.1" centers resulting in 100 pins per square inch. The switching portion includes a standardized input grid of input contacts contacting the output grid. The switching portion includes localized circuitry controlled by the controller to select specific nodes for testing.

A test interface as described above has several disadvantages in the testing of PC boards having areas of very high node density, such as areas surrounding a large central processing integrated circuit chip, where much higher pin density is required. One disadvantage is increased cost. Increasing the entire grid density is extremely expensive in additional structure, fabrication and assembly. A second disadvantage is simply physical constraints. Conventional pins and connectors do not permit connection of significantly higher density between the pin output grid and the switching portion of the interface.

Therefore, there has been a need for an improved test interface for testing PC boards of density exceeding the capabilities of conventional low-density interfaces and more specifically for a localized higher density interface including active switching circuitry for integration into a conventional low-density interface.

SUMMARY OF THE INVENTION

This invention is a test interface between a test controller and an electrical circuit to be tested via a test fixture, and it generally includes a plurality of spring probes, a plurality of switching boards and a connection to a controller. In the fixture, each translation pin has a first end disposed for electrical contact with a point to be tested on the circuit to be tested and has a second end; the second ends collectively forming an output grid. In the interface of the invention, each grid board includes a plurality of grid contacts printed on a peripheral receiving edge perpendicular to the boards faces, a plurality of buss contacts for electrical connection to the test controller, and a first circuit electrically connected to its grid contacts and its buss contacts. The plurality of grid boards are disposed such that the grid contacts form a receiving grid congruent with the output grid such that individual ones of the second ends of the translation pins make electrical contact with individual ones of the grid contacts. Preferably, the grid contacts residing in depressions. Preferably, the first circuit includes switching circuitry for receiving signals via the buss contacts from the test controller and, in response thereto, for electrically selectively connecting specific of the grid contacts with specific of the buss contacts for testing by the test controller.

In an exemplary embodiment, the grid boards are arranged in groupings, each grouping including a switching grid board, at least one receiving grid board and electrical connection between the buss contacts of the receiving grid board and a circuit on the switching grid board. The switching grid board including a plurality of buss contacts for connection to the test controller and an electrical circuit electrically connected to the grid contacts and to the buss contacts.

According to another embodiment of the invention, the high-density interface is integrated into a low density fixture interface by disposition between the low-density output grid and the electrical circuit to be tested.

Other features and many attendant advantages of the invention will become more apparent upon a reading of the following detailed description together with the drawings in which like reference numerals refer to like parts throughout.

BRIEF DESCRIPTION OF THE DRAWING

FIG. 3 is an enlarged partial perspective view of a preferred embodiment of the high-density interface of the invention.

FIG. 4 is a partial perspective view of an alternate embodiment of a high-density switching portion.

FIG. 5 is a reduced perspective view, partially cut away, of the high-density switching portion of FIG. 4.

DETAILED DESCRIPTION OF THE INVENTION

Figure 1:
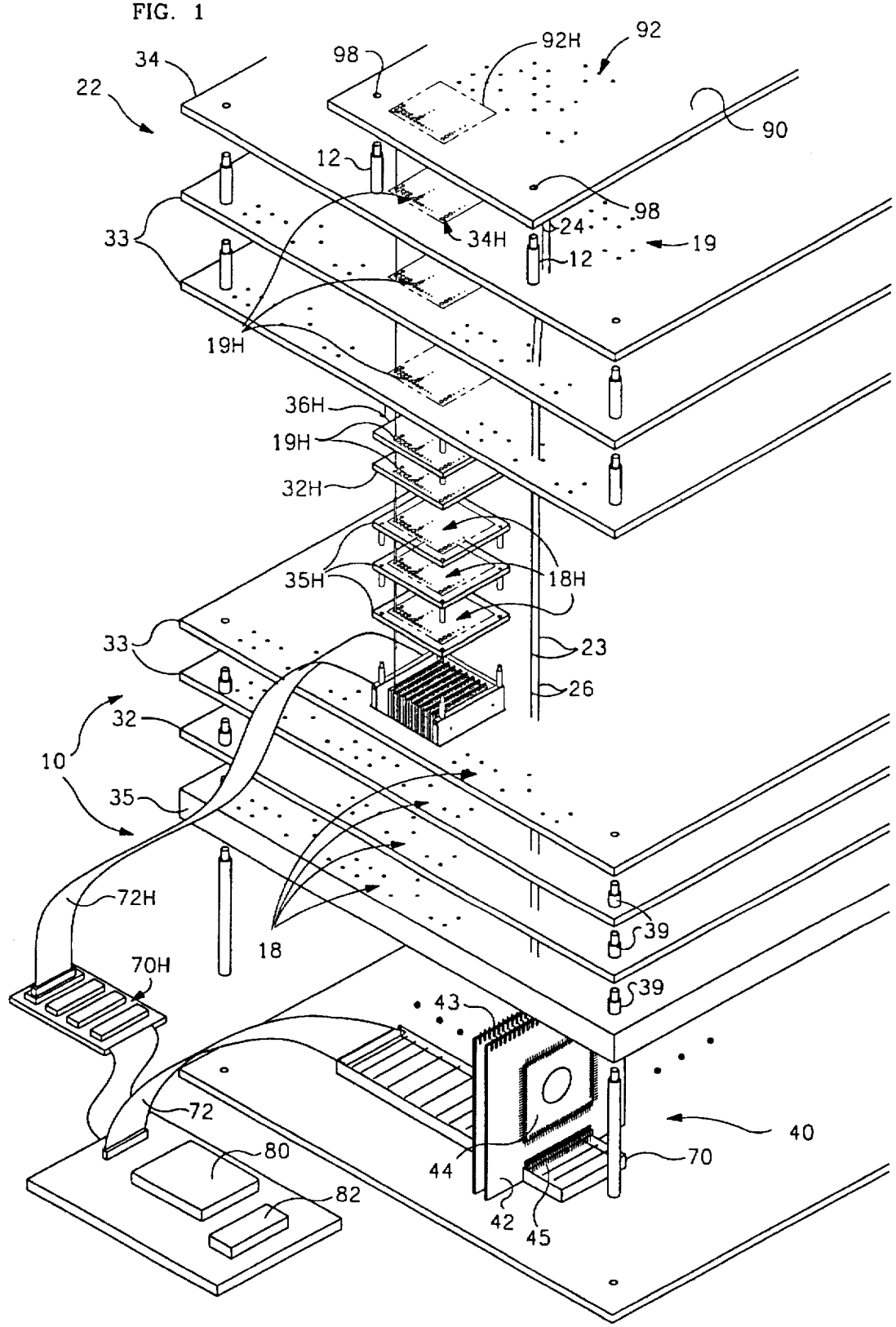
FIG. 1 is a partial, exploded perspective view of a PC board test interface incorporating the invention.
Figure 2:
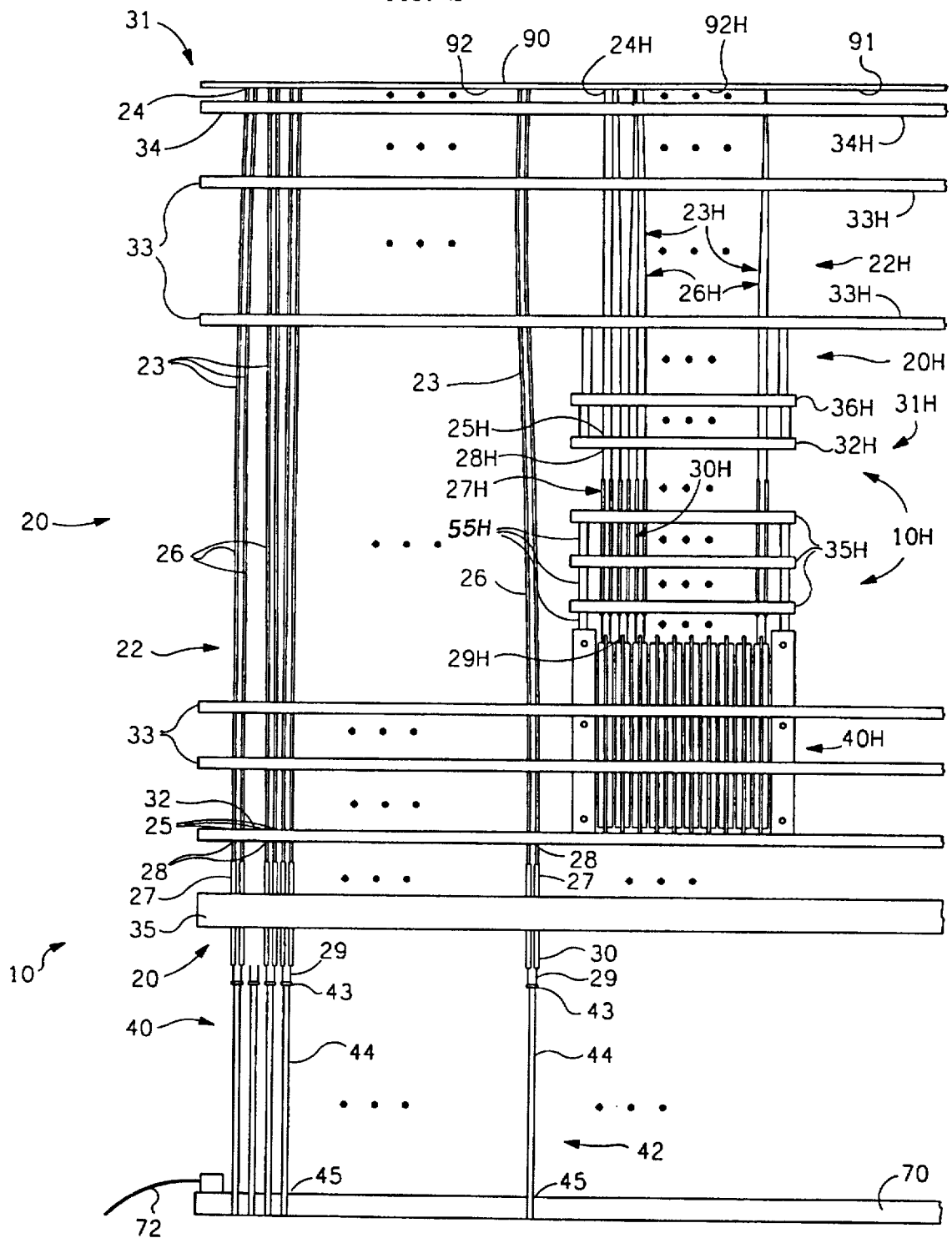
FIG. 2 is a side elevation view of the test interface of FIG. 1.

With reference now to the drawings, FIG. 1 is a partial, exploded perspective view of a PC board test interface 10 incorporating the invention and FIG. 2 is a side elevation view of the test interface 10 of FIG. 1.

The circuit to be tested, such as PC test board 90, is held in a testing position by means, such as registration pins 12 in registration bores 98. Although test board 90, shown, is a bare board, i.e. it does not include any components, it could include components. Test board 90 includes circuit or wiring nodes, shown in phantom and designated generally as 92, on the side 91 to be tested of board 90.

The conventional portions, that is the low-density test portions, of interface 10 include a test fixture portion, denoted generally as 20, a bed of nails switching portion, denoted generally as 40, and supporting structure.

Test fixture portion 20 includes a plurality of electrically conductive translation pins, designated generally as 22 specifically configured for testing the specific configuration of nodes 92 of PC board 90. For clarity, only two translation pins 22 are shown are shown in FIG. 1 and eight in FIG. 2. Typically there would be one hundred or more per square inch over the entire area of fixture 10. Typically, each translation pin 22 is comprised of two pins: a translator pin 23 of fixed length comprising a portion of the length of translation pin 22 and a resilient or biasing pin, such as spring probe 27, biased to an expanded position comprising another portion of the length of translation pin 22. Typically, each translator pin 23 has a first end 24 disposed for electrical contact with a node 92 on test board 90, a second end 25 and a mid-section 26 therebetween. The second ends 25 of translation pins 23 collectively form an output grid. A typical conventional output gird is on 0.1" centers resulting in 100 pins per square inch. Translator pins 23 are slidingly retained in bores 19 that pass through a plurality of guide plates 31. Second end 25 of each translator pin 23 is slidingly retained within a bore 19 of stripper plate 32, the bores of which correspond to the output grid. Translator pin 23 then passes typically through bores 19 in one or more intermediate plates 33, and finally through node plate 34, the bores of which are congruent with the board nodes 92 to be tested. The fixture plate bores 19 though each successive plate 33 are slightly altered so as to curve pins 23 from a board node location to a grid location.

Each spring probe 27 includes a first end 28, a second end 29 and a midsection 30 therebetween. Spring probes 27 are disposed through bores 18 in grid plate 35 and second ends 29 are located in bores 19 in output or stripper plate 32.

Second ends 29 of spring probes 27 form a standardized output grid for electrical connection to the input grid of switching portion 40. Spring probes 27 resiliently maintain translator pins 23 in contact with board nodes 92. Although, spring-loaded spring probes 27 are shown, other biasing means known in the art may be substituted therefor.

Structure, well-known in the art, such as spacers 39 and alignment columns 12, support and align the elements of interface 10, including plates 31,35.

Switching portion 40 includes a plurality of grid boards 42. Each grid board 42 includes grid contacts 43, a first circuit, such as switching circuit 44, and buss contacts 45. Grid contacts 43 are arranged to form the input grid of switching portion 40 congruent with the output grid of fixture portion 20 such that each grid contact 43 is in electrical contact with a second end 29 of a spring probe 27. A conventional input contact 43 comprises a pointed pin. A conventional spring probe second end 29 includes a hollow in the end for receiving the end of the input contact and retaining it. Buss contacts 45 are electrically connected to the test controller 80 including measurement circuitry 82. Switching circuitry 44, well-known in the art, connected to grid contacts 43 and buss contacts 45, receives signals from controller 80 and, in response thereto, electrically connects selected nodes 92 to controller 80 including measurement circuitry 82 for testing. Switching boards 42 are arranged in rows and columns to form an input grid under the entire test board 90. Controller connection means for electrically connecting buss contacts 45 to controller 80 includes one or more common mother boards or buss boards 70 into which each row of switching boards 42 is plugged and a plurality of mother board connectors 72 electrically connecting each buss board 70 to test controller 80.

The above describes one type of conventional circuit tester. The invention will be described primarily as an improvement to a conventional tester, although it will be seen that the invention can be used independently of this environment.

Again with reference to FIGS. 1 and 2, test PC board 90 includes an area of high density nodes 92H, such as may surround the location for an integrated circuit. Nodes 92H are too numerous and close together for contact for testing by conventional fixture portion 20.

To solve this problem, test interface 10 includes a localized high-density portion, denoted generally as 10H. Preferably, high-density portion 10H is a complete interface that can interposed within the guide plates 31 of conventional interface 10 such that the conventional stripper plate 32 and grid plate 35 and switching portion 40 including grid boards 42 need not be altered and can remain in position and function around high density portion 10H.

High density portion 10H is composed of the same functional elements as the low-density portion 10. These include a fixture portion, denoted generally as 20H, a switching portion, denoted generally as 40H, and supporting structure.

Fixture portion 20H includes a bed of electrically conductive translation pins, designated generally as 22H. Typically, each translation pin 22H is comprised of two other pins: a translator pin 23H of fixed length comprising a portion of the length of translation pin 22H and a resilient or biasing pin, such as spring probe 27H biased to an expanded position, comprising another portion of the length of translation pin 22H. Each translator pin 23H has a first end 24H disposed for electrical contact with a node 92H on test board 90, a second end 25H and a mid-section 26H therebetween. The second ends 25H of translation pins 22H collectively form an output grid.

Translator pins 23H are slidingly retained in bores that pass through a plurality of guide plates 31H. Second end 25H of each translator pin 23H is slidingly retained in a bore 18H of stripper plate 32H, the bores 19H of which correspond to the output grid, and then typically through bores 19H in one or more intermediate plates 33H, and finally through node plate 34H; the bores 19H of node plate 34H being congruent with the board nodes 92H to be tested. The bores 19H though each successive plate 33H are slightly altered in location so as to curve pins 23H from a board node location to a grid location. Low-density guide plates 31 may be used as high density guide plates 31H or may be cut-out to allow passage of pins 22H. One or more high-density plates 31H may be a localized plate, such as localized high-density stripper plate 32H and localized high-density plate 36H that are independently mounted and separated from low-density guide plates 31.

Each spring probe 27H includes a first end 28H, a second end 29H and a midsection 30H therebetween. Spring probes 27H are disposed through bores in grid plate 35H. In the preferred embodiment, grid plate 35H is comprised of several separated plates. Second ends 29H of spring probes 27H form a high-density output grid for electrical connection to the input grid of switching portion 40H. Spring loaded spacers 55H separate grid plates 35H from stripper plate 32H to allow spring probe 27H to compress within the overall structure 10H. Spring probes 27H resiliently maintain translator pins 23H in contact with board nodes 92H. Although, spring probes 27H are shown, other biasing means known in the art may be substituted therefor. In the example shown, the high-density output gird is on 0.032" centers in a first direction and 0.050" in the orthogonal resulting in 640 pins per square inch. Preferably, the high-density grid plates 35H and guide plates 31H are planar and parallel.

High-density switching portion 40H is best described with reference to FIGS. 3–5. FIG. 3 is an enlarged partial perspective view of a preferred embodiment of the high-density interface 10H of the invention.

Looking first at FIG. 3, high-density switching portion 40H includes a plurality of grid boards 42H of which only two are shown. Grid boards 42H are arranged in rows and columns to form an input grid under the high-density nodes 92H of test board 90. Each grid board 42H includes grid contacts 43H, a first circuit, such as switching circuit 44H, and buss contacts 45H. Each grid board is typically about 0.025–0.028" or less in thickness and includes first and second substantially planar and parallel faces 46H, 47H and a receiving edge 48H on the periphery traversing between faces 46H, 47H. Receiving edge 48H includes a plurality of depressions 49H that contain grid contacts 43H. The plane of grid contacts 43H is perpendicular to the plane of faces 46H, 47H. Preferably, depressions 49H are sections of plated bores. Depressions 49H may have center spacings of 0.032" or less, and grid boards 42H can be placed extremely close together such that grid densities in excess of one thousand pins per square inch may be obtained.

Grid contacts 43H are arranged to form the input grid of switching portion 40H congruent with the output grid of fixture portion 20H such that each input contact 43H is in electrical contact with a second end 29H of a spring probe 27H.

Grid board 42H includes on its periphery an output edge 50H traversing between its faces 46H, 47H. Output edge 50H includes a plurality of depressions 51H that contain buss contacts 45H. Preferably, depressions 51H are sections of plated bores and form a planar output array such that a plurality of buss wires 71H, of which only two are shown, may be connected, such as by soldering, thereto to form a buss cable connector 72H, as seen in FIGS. 2 and 4, for connection to mother board extended 70H, as shown in FIG. 1, or to conventional buss board 70 or directly to test controller 80 (not shown). Buss 72H is comprised of a number of signal lines.

Switching circuitry 44H, well-known in the art, connected to input contacts 43H and to buss contacts 45h, receives signals from controller 80 via signal lines of buss 71H, 72H and, in response thereto, electrically connects selected nodes 92H of test board 90 to controller 80 for testing. Switching circuitry 44H allows use of a buss 72H having a very small number of signal lines compared to the number of high-density grid contacts 43H. In the given example, a buss 72H having only 32 signal lines can accommodate testing of the 640 grid contacts.

In this manner, one or more high-density interfaces 10H can be integrated easily into an existing low-density interface 10 as necessitated by board areas of density exceeding the capabilities of the low-density interface.

FIG. 4 is a partial perspective view of an alternate embodiment of a high-density switching portion 40A. FIG. 5 is a reduced partial perspective view, partially cut away, of high-density switching portion 40A.

Alternate interface 10A is very similar to interface 10H except as noted. Fixture portion 20A is similar to fixture portion 20H and includes spring probes 27 having second ends 29. High-density switching portion 40A differs somewhat from high-density switching portion 40H in that switching portion 40A takes advantage of the fact that only one switching circuitry 44C can accommodate the switching for a plurality of grid boards 42A. Switching portion 40A includes a plurality of printed circuit board groupings 41. Each grouping includes a plurality of adjacent and electrically interconnected grid boards 42A. Each grouping 41 includes at least one switching grid board 42C and at least one receiving grid board 42R. Each grid board 42A includes grid contacts 43H, output contacts 45R or buss contacts 45H and electrical circuit means electrically connected to grid contacts 43H and to output contacts 45R or buss contacts 45H. FIG. 5 shows a corner portion of a single board grouping 41.

Also, each grid board includes first and second substantially planar and parallel faces 46H, 47H and a receiving edge 48H on the periphery traversing between faces 46H, 47H. Receiving edge 48H includes a plurality of depressions 49H that contain grid contacts 43H. Preferably, depressions 49H are sections of plated bores in grid board 42A.

Grid boards 42A are disposed in a plurality of groupings 41 with faces parallel such that grid contacts 43H are arranged to form the input grid of switching portion 40A congruent with the output grid of fixture portion 20H such that each input contact 43H is in electrical contact with second end 29 of a spring probe 27. Grid boards 42A are arranged in rows and columns to form an input grid under the high-density nodes 92H of test board 90. In the drawing, only one row of grid boards 42H is shown.

Each switching grid board 42C includes on its periphery an output edge 50H traversing between its faces 46H, 47H. Output edge 50H includes a plurality of depressions 51H that contain buss contacts 45H. Preferably, depressions 51H are sections of plated bores and form a planar output array. A plurality of buss wires 71H, of which only one is shown, may be connected, such as by soldering, to the array of buss contacts 45H to form a buss connector 72H for connection to conventional buss board 70, as shown in FIG. 1 or directly to test controller 80. Switching circuitry 44H allows use of a buss 72H having a very small number of signal lines compared to the number of high-density grid contacts 43H. In the given example, a buss 72H having only 32 signal lines can accommodate testing of the 640 grid contacts.

A first connection means electrically connects output contacts 45R of receiving grid board 42R to electrical circuit means, such as switching circuitry 44C, of switching grid board 42C. In the preferred embodiment shown, first connection means includes spacer board 60 between receiving board 42R and switching board 42C. Spacer board 60 may have any thickness but a thickness of 0.010" has been used. Spacer board 60 has parallel faces with a set of electrical contacts 63 on each face and electrical connection between contacts 63 on opposite faces. Contacts 63 facing receiving board 42R align with output contacts 45R of receiving board 42R and connected contacts 63 facing switching board 42C align with contacts 43T of switching circuitry 44C thereon. Preferably, output contacts 45R of receiving board 42R and contacts 43T of switching board 42C are aligned so that contacts 63 can simply be plated through-bores. Electrical connection can be made by pressure contact, reflow solder or contact pin through the bores.

Physically, preferably, output edge 50H of switching grid board 42 protrudes past the adjacent edge of spacer board 60 and receiving board 42R to facilitate attachment of buss wires 71H. Preferably, a portion of spacer board 60 is physically between the second ends 29H of spring probes 27H on receiving grid board 42R and the second ends 29H of spring probes 27H on switching grid board 42C to prevent shorting.

Electrical circuit means, such as switching circuit 44C, as is well-known in the art, electrically connected to input contacts 43H of both receiving grid board 42R and switching grid board 42C and to buss contacts 45H, receives signals from controller 80 via buss 71H and, in response thereto, electrically connects selected nodes 92H to controller 80 for testing.

Turning to FIG. 4, a plurality of board groupings 41 is contained and supported by housing 77. Only three groupings 41 are shown out of a typical ten or more.

Having described the invention, it can be seen that it provides for easily integrating one or more localized high-density interfaces 10H into an existing low-density interface 10 as necessitated.

Also, it is obvious that high-density interface 10H can be used independently, that is it may be used independently to test circuitry.

Although particular embodiments of the invention have been illustrated and described, various changes may be made in the form, composition, construction, and arrangement of the parts without sacrificing any of its advantages. Therefore, it is to be understood that all matter herein is to be interpreted as illustrative and not in any limiting sense, and it is intended to cover in the appended claims such modifications as come within the true spirit and scope of the invention.

I claim:

1. In a test interface (10) between a first side (91) of an electrical circuit (90) to be tested and a test controller (80); the test interface (10) comprising a low-density portion and a localized high-density portion (10H);
said low-density portion comprising:
   low-density translation means including:
      a plurality of electrically conductive low-density translation pins (22), each said low-density translation pin (22) including:
         a first end (24) disposed for electrical contact with a point to be tested on the circuit (90) to be tested; and
         a second end (29); the second ends (29) of said low-density translation pins (22) arranged in a predetermined low-density output pattern;
   a low density receiving grid comprising:
      a plurality of low-density grid contacts (43) arranged such that individual ones of said second ends (29) of said translation pins (22) make electrical contact with individual ones of said low-density grid contacts (43); and
   controller connection means (40, 70, 72) for electrically connecting said low-density grid contacts (43) to the test controller (80) for testing; and
said localized high-density portion (10H) comprising:
   high-density translation means including:
      a plurality of electrically conductive high-density translation pins (22H), each said high-density translation pin (22H) having a first end (24H) disposed for electrical contact with a point to be tested on the circuit (90) to be tested and having a second end (29H); said second ends (29H) of said high-density translation pins (22H) arranged in a predetermined high-density output pattern disposed between the low-density output pattern and the electrical circuit (90) to be tested;
   a plurality of grid boards (42H); each said grid board (42H) including:
      a plurality of high-density grid contacts (43H); said plurality of grid hoards (42H) disposed such that individual ones of said second ends (29H) of said high-density translation pins (22H) make electrical contact with individual ones of said high-density grid contacts (43H);
      a plurality of buss contacts (45H);
   a buss (72H) comprised of a plurality of signal lines (71H) electrically connecting said buss contacts (45H) to the test controller (80);
   first circuit means electrically connected to said high-density grid contacts (43H) and to said buss contacts (45H); said first circuit means including:
      switching circuitry (44H) for receiving signals via said buss contacts (45H) from the test controller (80) and, in response thereto, for electrically selectively connecting specific of said grid contacts (43H) with specific of said buss contacts (45H) for testing by the test controller (80).

2. The test interface of claim 1:
the number of said signal lines of said buss being substantially less than the number of said high-density grid contacts.

3. The test interface of claim 1:
each grid board including:
   first and second substantially planar and parallel faces;
   a receiving edge on the periphery of said grid board; said receiving edge traversing between said faces of its said grid board; said plurality of high-density grid contacts being printed on said receiving edge.

4. The test interface of claim 3:
each said receiving edge including a plurality of depressions; said grid contacts residing in said depressions.

5. The test interface of claim 1:
each said grid board including:
   first and second substantially planar and parallel faces; and
   an output edge; said output edge traversing between its said faces; said plurality of buss contacts being printed on said output edge.

6. In a test interface (10) between a first side (91) of an electrical circuit (90) to be tested and a test controller (80); the test interface (10) comprising a low-density portion and a localized high-density portion (10H);
said low-density portion comprising:
   low-density translation means including:
      a plurality of electrically conductive low-density translation pins (22), each said low-density translation pin (22) including:
         a first end (24) disposed for electrical contact with a point to be tested on the circuit (90) to be tested; and
         a second end (29); the second ends (29) of said low-density translation pins (22) arranged in a predetermined low-density output pattern;
   a low density receiving grid comprising:
      a plurality of low-density grid contacts (43) arranged such that individual ones of said second ends (29) of said translation pins (22) make electrical contact with individual ones 20 of said low-density grid contacts (43); and controller connection means (40, 70, 72) for electrically connecting said low-density grid contacts (43) to the test controller (80) for testing; and said localized high-density portion (10H) comprising:

high-density translation means including:

a plurality of electrically conductive high-density translation pins (22H), each said high-density translation pin (22H) having a first end (24H) disposed for electrical contact with a point to be tested on the circuit (90) to be tested and having a second end (29H); said second ends (29H) of said high-density translation pins (22H) arranged in a predetermined high-density output pattern disposed between said low-density output pattern and the electrical circuit (90) to be tested;

a plurality of grid boards (42H); each said grid board (42H) including:

a plurality of high-density grid contacts (43H); said plurality of grid boards (42H) disposed such that individual ones of said second ends (29H) of said high-density translation pins (22H) make electrical contact with individual ones of said high-density grid contacts (43H); said plurality of grid boards (42H) disposed in a plurality of groups (41); each group (41) including:

a receiving grid board (42R) including:

first connection means (60) electrically connecting its said grid contacts (43H) to a first circuit means of a connected switching grid board (42C); and a switching grid board (42C); each switching grid board (42C) including:

a plurality of buss contacts (45H);

first circuit means for electrically connecting its said high-density grid contacts (43H) to its said buss contacts (45H); said first circuit means including:

switching circuitry means for receiving signals via said buss contacts (45H) from the test controller (80) and, in response thereto, for electrically selectively connecting specific of its said high-density grid contacts (43H) and specific of said high-density grid contacts (43H) of its said receiving grid board (42R) with specific of said buss contacts (45H) for testing by the test controller (80); and a buss (72H) comprised of a plurality of signal lines (71H) electrically connecting said buss contacts (45H) of said switching grid boards (42C) to the test controller (80).

7. The test interface of claim 6:

the number of said signal lines of said buss being substantially less than the number of said high-density grid contacts .

8. The test interface of claim 6:

each grid board including:

first and second substantially planar and parallel faces;
a receiving edge on the periphery of said grid board; said receiving edge traversing between said faces of its said grid board; said plurality of high-density grid contacts being printed on said receiving edge.

9. The test interface of claim 8:

each said receiving edge including a plurality of depressions; said grid contacts residing in said depressions.

10. The test interface of claim 6:

each said switching grid board including:

first and second substantially planar and parallel faces; and an output edge; said output edge traversing between its said faces; said plurality of buss contacts being printed on said output edge.

11. A test interface (10) between an electrical circuit (90) to be tested and a test controller (80); the test interface (10) including:

translation means including a plurality of electrically conductive translation pins (22H), each said translation pin (22H) having a first end (24H) disposed for electrical contact with a point to be tested on the circuit (90) to be tested and having a second end (29H); said second ends (29H) of said translation pins (22H) arranged in a predetermined output pattern;

a plurality of grid boards (42H); each said grid board (42H) including:

first (46H) and second (47H) substantially planar and parallel faces;

a receiving edge (48H) on the periphery of said grid board (42H); said receiving edge (48H) traversing between said faces (46H, 47H) of its said grid board (42H); and a plurality of grid contacts (43H) printed on said receiving edge (48H);

a plurality of buss contacts (45H) for electrical connection to the test controller (80);

first circuit means electrically connected to said grid contacts (43H) and said buss contacts (45H);

said plurality of grid boards (42H) disposed such that said faces (46H, 47H) are parallel to one another and such that said grid contacts (43H) are arranged such that individual ones of said second ends (29H) of said translation pins (22H) make electrical contact with individual ones of said grid contacts (43H); and a buss (72H) comprised of a plurality of signal lines (71H) electrically connecting said buss contacts (45H) to the test controller (80).

12. The test interface of claim 11:

each said receiving edge including a plurality of depressions; said grid contacts residing in said depressions.

13. The test interface of claim 11:

said first circuit means including:

switching circuitry for receiving signals via said buss contacts from the test controller and, in response thereto, for electrically selectively connecting specific of said grid contacts with specific of said buss contacts for testing by the test controller.

14. The test interface of claim 13:

the number of said signal lines of said buss being substantially less than the number of said high-density grid contacts.

15. The test interface of claim 11:

each said grid board including on its periphery an output edge;

said output edge traversing between its said faces; and wherein said plurality of buss contacts for electrical connection to a test controller are printed on said output edge.

16. In a test interface (10) between an electrical circuit (90) to be tested and a test controller (80); the test interface (10) including:

translation means including a plurality of electrically conductive translation pins (22H), each said translation pin (22H) having a first end (24H) disposed for electrical contact with a point to be tested on the circuit (90)

to be tested and having a second end (29H); said second ends (29H) of said translation pins (22H) arranged in a predetermined output pattern;

a plurality of printed circuit board groupings (41); each said grouping (41) including a plurality of adjacent and electrically interconnected grid boards (42H): each grid board (42H) including:

first (46H) and second (47H) substantially planar and parallel faces;

a receiving edge (48H) on the periphery of said grid board (42H); said receiving edge (48H) traversing between said faces (46H, 47H) of its said grid board (42H); and an electrical circuit including:

a printed circuit including:

a plurality of grid contacts (43H) printed on said receiving edge (48H);

said grid boards (42h) in said plurality of groupings (41) disposed such that said faces (46H, 47H) are parallel to one another and such that said grid contacts (43H) are arranged such that individual ones of said second ends (29H) of said translation pins (22H) make electrical contact with individual ones of said grid contacts (43H);

each grouping (41) including:

at least one switching grid board (42C) including:

a plurality of buss contacts (45H) for connection to the test controller (80); and electrical circuit means electrically connected to said grid contacts (43H), to said buss contacts (45H) and to a first connection means (60); and at least one receiving grid board (42R); and first connection means (60) electrically connecting said grid contacts (43H) of said receiving grid board (42R) to said electrical circuit means of said switching grid board (42C); and a buss (72H) comprised of a plurality of signal lines (71H) electrically connecting said buss contacts (45H) to the test controller (80).

17. The test interface of claim 15:

each said receiving edge including a plurality of depressions; said grid contacts residing in said depressions.

18. The test interface of claim 15:

said electrical circuit means including:

switching circuitry means for receiving signals via said buss contacts from the test controller and, in response thereto, for electrically selectively connecting specific of said grid contacts from its said grouping with specific of said buss contacts for testing by the test controller.

19. The test interface of claim 18:

the number of said signal lines of said buss being substantially less than the number of said high-density grid contacts.

20. The test interface of claim 15:

each said switching board including on its periphery an output edge; said output edge traversing between its said faces; and wherein said plurality of buss contacts for electrical connection to a test controller are printed on said output edge.

21. The test interface of claim 20:

said output edge including a plurality of depressions; said buss contacts residing in said depressions.

\* \* \* \* \*